(12) United States Patent
Hsu et al.

(10) Patent No.: US 7,816,190 B2
(45) Date of Patent: Oct. 19, 2010

(54) E-INK DISPLAY AND METHOD FOR REPAIRING THE SAME

(75) Inventors: Yu-Chen Hsu, Hsinchu (TW); Chi-Ming Wu, Hsinchu (TW)

(73) Assignee: Prime View International Co. Ltd., Hsinchu (TW)

( * ) Notice: Subject to any disclaimer, the term of this patent is extended or adjusted under 35 U.S.C. 154(b) by 476 days.

(21) Appl. No.: 11/709,984

(22) Filed: Feb. 23, 2007

(65) Prior Publication Data

US 2007/0224742 A1 Sep. 27, 2007

(30) Foreign Application Priority Data

Mar. 23, 2006 (TW) ............... 95110155 A

(51) Int. Cl.
*H01L 21/84* (2006.01)

(52) U.S. Cl. ............... 438/149; 438/4; 438/467; 257/E27.131; 257/149; 257/59

(58) Field of Classification Search ............ 257/59, 257/209, E27.131, 149; 438/149, 4
See application file for complete search history.

(56) References Cited

U.S. PATENT DOCUMENTS

| | | | | |
|---|---|---|---|---|
| 6,313,889 B1 * | 11/2001 | Song et al. | ............ | 349/54 |
| 6,646,694 B2 * | 11/2003 | Lee | ............ | 349/55 |
| 7,279,709 B2 * | 10/2007 | Lan et al. | ............ | 257/59 |
| 2007/0200813 A1 * | 8/2007 | Liu | ............ | 345/92 |

FOREIGN PATENT DOCUMENTS

| | | |
|---|---|---|
| JP | 10003088 | 1/1998 |
| JP | 11311806 | 11/1999 |
| JP | 2002169190 A | 6/2002 |
| JP | 2006047362 | 2/2006 |
| KR | 1020030011563 A | 2/2003 |
| KR | 1020050058106 A | 6/2005 |
| KR | 1020050112878 A | 12/2005 |

* cited by examiner

*Primary Examiner*—Matthew S Smith
*Assistant Examiner*—Wilner Jean Baptiste
(74) *Attorney, Agent, or Firm*—Peter A. Nieves; Sheehan Phinney Bass + Green, PA

(57) ABSTRACT

An E-ink display and method for repairing the same is provided. The method is for repairing a thin film transistor array substrate of the E-ink display. The thin film transistor array substrate having a plurality of pixel units is provided initially. Each of the pixel unit includes a thin film transistor and a pixel electrode. The thin film transistor has a gate electrode, a source electrode and a drain electrode. The gate electrode, the source electrode and the drain electrode are connected electrically to a scan line, a data line and the pixel electrode respectively. A portion of the pixel electrode is located above the data line. Next, a repairing portion is formed at the space between the data line and the pixel electrode. The repairing portion is utilized to electrically connect the pixel electrode and the data line.

4 Claims, 4 Drawing Sheets

E-INK DISPLAY AND METHOD FOR REPAIRING THE SAME

RELATED APPLICATIONS

The present application is based on, and claims priority from, Taiwan Application Ser. No. 95110155, filed Mar. 23, 2006, the disclosure of which is hereby incorporated by reference herein in its entirety.

BACKGROUND

1. Field of Invention

The present invention relates to a display and a method for repairing the same, and more particularly, to an E-ink display and a method for repairing the same.

2. Description of Related Art

In recent years, there has been an increasing demand for a thin display device with low power consumption. An example of such display device is an electronic-ink (E-ink) display with a display layer formed by electrically charged, electrophoretically mobile particles capable of translating through a dispersion fluid (dielectric fluid) upon application of an electric field to the medium. Varying the dispersion state of electrophoretic particles by an electric field changes the optical characteristics of the display layer, so the E-ink display can display a desired image. Moreover, the E-ink display can be a reflection-type and bistable display device that is expected to be lower power consumption.

A thin film transistor array substrate including a plurality of pixel units can be utilized to drive an E-ink display. Each of the pixel units has a thin film transistor serving as a switching element for each pixel unit. However, a defective thin film transistor may lead the pixel unit to be a white spot or a dark spot.

The white spot or the dark spot may damage the quality of the E-ink display seriously. Accordingly, how to provide an E-ink display and a method for repairing the same, which can repair a defective pixel unit manifested as a white spot or a dark spot on the screen is an issue of great consequence to improve the quality of the E-ink display.

SUMMARY

The present invention provides an E-ink display and a method for repairing the same, which can repair a defective pixel unit manifested as a white spot or a dark spot on the screen, in order to improve the quality of the E-ink display.

It is another aspect of the present invention to provide an E-ink display and a method for repairing the same, which can prevent structural damage in the repairing process, so that the yield of the E-ink display can be improved.

Accordingly, the present invention provides a method for repairing a thin film transistor array substrate of an E-ink display. The thin film transistor array substrate has a plurality of pixel units. Each of the pixel units is connected with a scan line and a data line. At least one of the pixel units is defective. The method includes the following steps. The thin film transistor array substrate is initially provided. Each of the pixel unit includes a thin film transistor and a pixel electrode. The thin film transistor has a gate electrode, a source electrode and a drain electrode. The gate electrode, the source electrode and the drain electrode are connected electrically to the scan line, the data line and the pixel electrode respectively. A portion of the pixel electrode is located above the data line. A repairing portion is formed at the space between the data line and the pixel electrode. The repairing portion is utilized to electrically connect the pixel electrode and the data line.

The present invention also provides a method for repairing a thin film transistor array substrate of an E-ink display. The thin film transistor array substrate has a plurality of pixel units. Each of the pixel units is connected with a scan line and a data line. At least one of the pixel units is defective. The method includes the following steps. The thin film transistor array substrate is provided initially. Each of the pixel unit includes a thin film transistor and a pixel electrode. The thin film transistor has a gate electrode, a source electrode and a drain electrode. The gate electrode, the source electrode and the drain electrode are connected electrically to the scan line, the data line and the pixel electrode respectively. The data line has a protruding portion. A portion of the pixel electrode is located above the protruding portion. A repairing portion is formed at the space between the protruding portion and the pixel electrode. The repairing portion is utilized to electrically connect the pixel electrode and the data line.

The present invention also provides an E-ink display including a first substrate, a second substrate and an E-ink layer. The first substrate has a plurality of pixel units. Each of the pixel units is connected with a scan line and a data line. At least one of the pixel units is repaired. The second substrate is opposed to the first substrate. The second substrate has a transparent electrode layer. The E-ink layer is sandwiched between the first substrate and the second substrate. The E-ink layer has a plurality of charged particles and liquid. The optical characteristics of the pixel unit are varied by the dispersion state of charged particles in the liquid. Each of the pixel unit includes a thin film transistor and a pixel electrode. The thin film transistor has a gate electrode, a source electrode and a drain electrode. The gate electrode, the source electrode and the drain electrode are connected electrically to the scan line, the data line and the pixel electrode respectively. A portion of the pixel electrode is located above the data line. A repairing portion is formed at the space between the data line and the pixel electrode. The repairing portion is utilized to electrically connect the pixel electrode and the data line.

According to preferred embodiments, a defective pixel unit can be repaired by connecting a pixel electrode and a data line of the pixel unit electrically, thus improving the quality of the E-ink display. Moreover, since a repairing portion can be formed at the space between the data line and the pixel electrode, a defective pixel unit can be repaired without any added structure. Further, repairing the pixel unit at the space between the protruding portion and the pixel electrode can prevent the data line from being damaged during the laser welding process, thus increasing the yield of the E-ink display.

It is to be understood that both the foregoing general description and the following detailed description are by examples and are intended to provide further explanations of the invention as claimed.

BRIEF DESCRIPTION OF THE DRAWINGS

These and other features, aspects and advantages of the invention will become apparent by reference to the following description and accompanying drawings, which are given by way of illustration only, and thus are not limitative of the invention, wherein.

DESCRIPTION OF THE PREFERRED EMBODIMENTS

Figure 1:
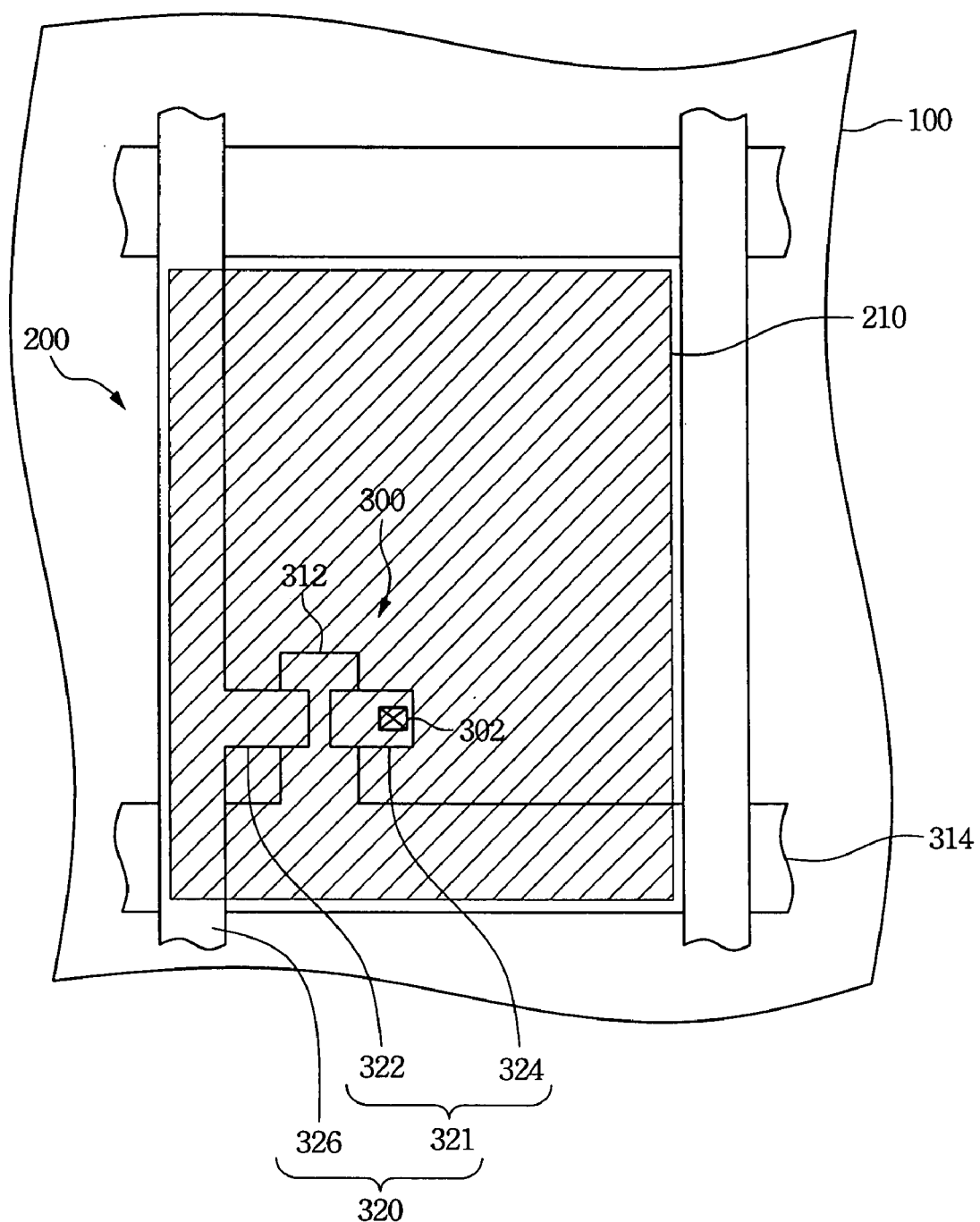
FIG. 1 illustrates a pixel unit of a thin film transistor array substrate according to the preferred embodiment of the present invention.

FIG. 1 illustrates a pixel unit of a thin film transistor array substrate according to the preferred embodiment of the present invention. With reference to FIG. 1, a pixel unit 200 disposed on a first substrate 100 of a reflection-type E-ink display includes a thin film transistor 300 and a pixel electrode 210. The pixel unit 200 is connected with a scan line 314 and a data line 326. The thin film transistor 300 has a gate electrode 312 connected electrically to the scan line 314, a source electrode 322 connected electrically to the data line 326 and a drain electrode 324 connected electrically to the pixel electrode 210 via a contact window 302. It is worth noting that a portion of the pixel electrode is located above the data line 326, the scan line 314 and the thin film transistor 300.

Figure 2:
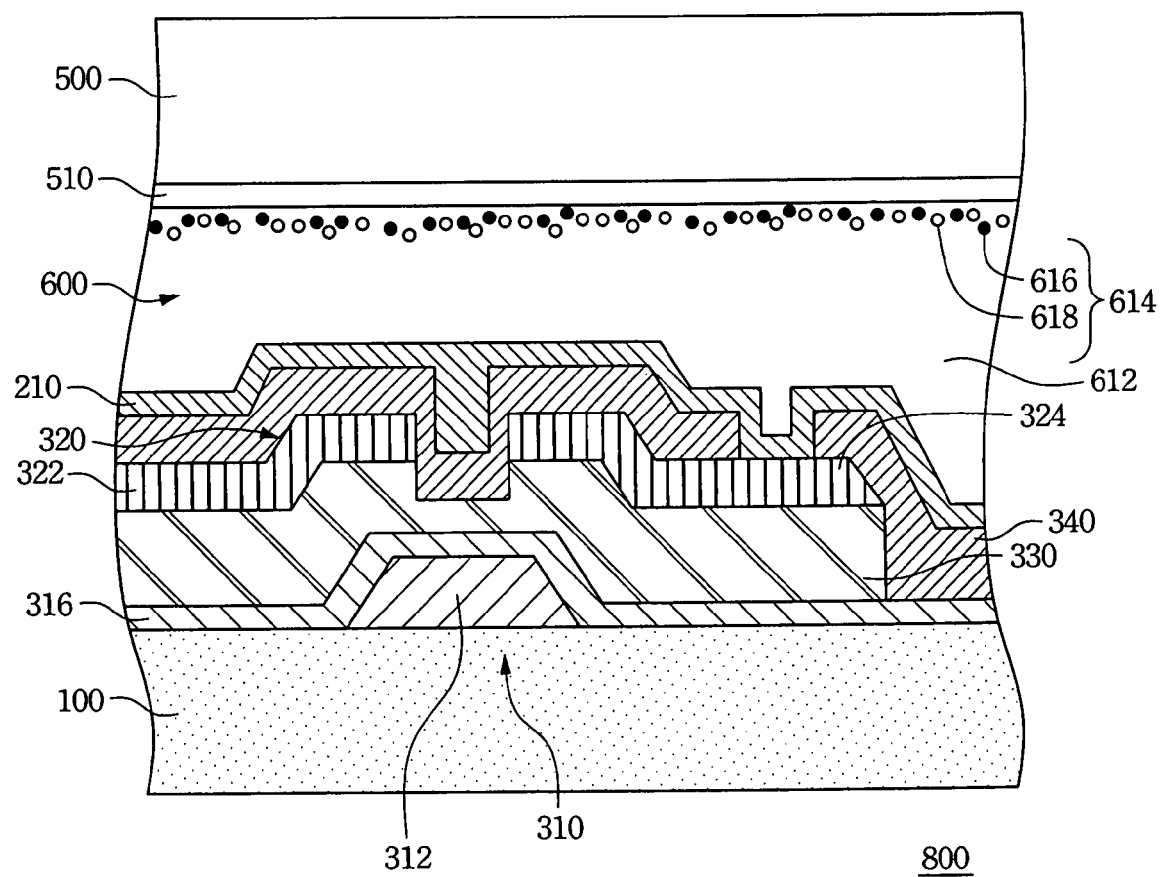
FIG. 2 illustrates a partial, cross-sectional view of an E-ink display according to the preferred embodiment of the present invention.

FIG. 2 illustrates a partial, cross-sectional view of an E-ink display according to the preferred embodiment of the present invention. Referring to FIG. 1 and FIG. 2, the E-ink display 800 includes a first substrate 100, a second substrate 500 opposed to the first substrate 100 and an E-ink layer 600 sandwiched between the first substrate 100 and the second substrate 500. The E-ink layer 600 includes a plurality of charged particles 614 and liquid 612. The optical characteristics of the display layer 600 are varied by the dispersion state of charged particles 614 in the liquid 612. In accordance with an embodiment of the present invention disclosed herein, the charged particles 614 include a plurality of positively charged particles 616 and a plurality of negatively charged particles 618. The positively charged particles 616 have a different color to the negatively charged particles 618. For example, the positively charged particles 616 are black and the negatively charged particles 618 are white, or vice versa.

The pixel unit 200 presents the color of the positively charged particles 616 when the positively charged particles 616 are affected to move up (direction of users) and the negatively charged particles 618 are affected to move down by an electric field, or vice versa. It should be noted that the present invention is not intended to be limited to the embodiment. In a preferred embodiment, the charged particles 614 and the liquid 612 can be contained in a plurality of microcapsules or a plurality of microcups. In another preferred embodiment, the charged particles 614 and the liquid 612 can be dispensed freely in an active region of the E-ink layer 600 without any lateral structural constrain.

With continued reference to FIG. 1 and FIG. 2, the first substrate 100 and the second substrate 500 may be made of glass or flexible material. The second substrate 500 has a transparent electrode 510 made of indium tin oxide (ITO). The first substrate 100 has a first conductive layer 310, a first dielectric layer 316, a channel layer 330, a second conductive layer 320 and a pixel electrode 210 disposed thereon. The first conductive layer 310 including a scan line 314 as well as a gate electrode 312 may be made of AlNd. The gate electrode 312 connects electrically with the scan line 314. The first dielectric layer 316 disposed on the first substrate 100 and covering the first conductive layer 310 may be made of SiNx. The channel layer 330 disposed on the gate electrode 312 as well as the first dielectric layer 316 may be made of amorphous silicon or polysilicon.

The second conductive layer 320 may be made of materials selected from the group consisting of Aluminum, Titanium, Tungsten, Molybdenum and combinations thereof. The second conductive layer 320 includes the data line 326, the source electrode 322 and the drain electrode 324. The second dielectric layer 340 disposed on the first dielectric layer 316 and covering the second conductive layer 320 may be made of SiNx. The pixel electrode 210 disposed on the second dielectric layer 340 may be made of ITO. When a driving voltage is provided to the pixel electrode 210, the charged particles 614 are affected by the electric field between the transparent electrode 510 and the pixel electrode 210. The charged particles 614 move toward the transparent electrode 510 or the pixel electrode 210, thus changing optical characteristics of the pixel unit 200. It should be noted that the thin film transistor 300 can be a top-gate-type thin film transistor or a bottom-gate-type thin film transistor.

Figure 3:
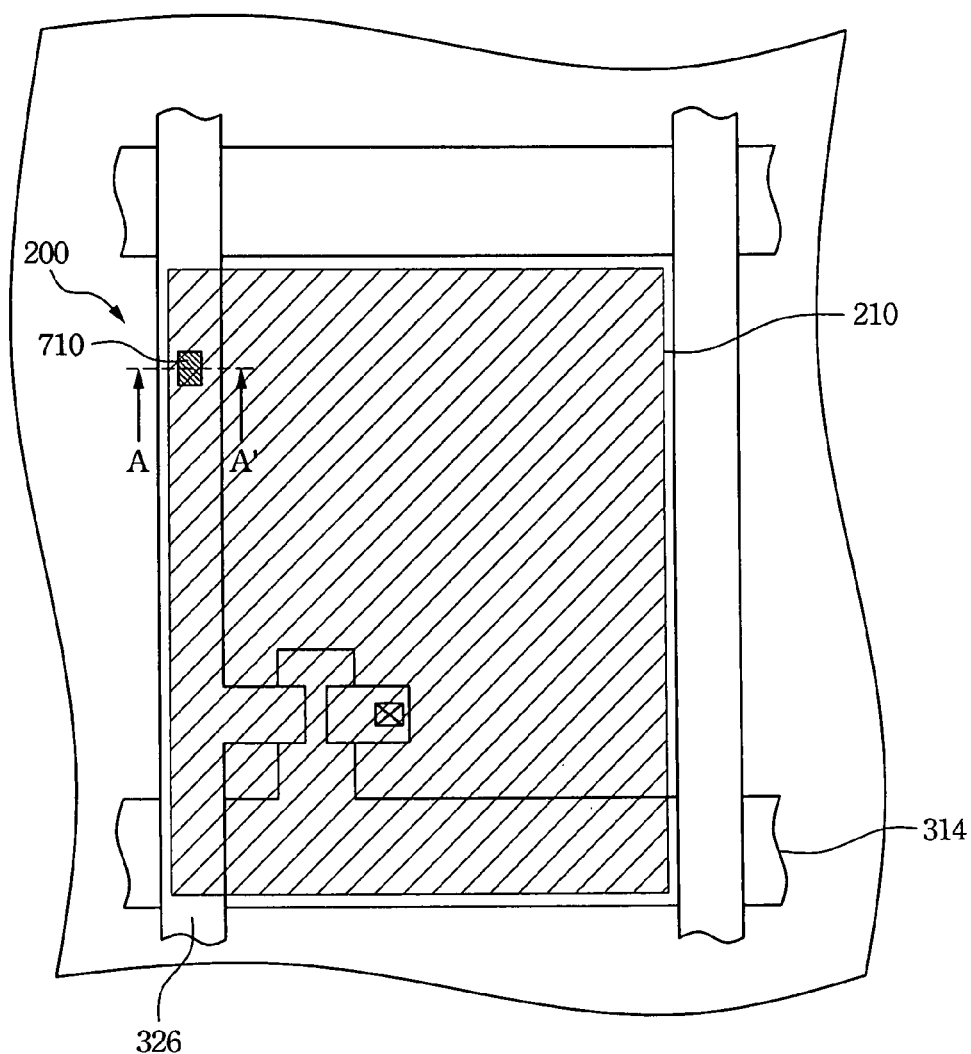
FIG. 3 illustrates a repaired pixel unit according to the preferred embodiment in FIG. 1 of this invention.
Figure 3A:
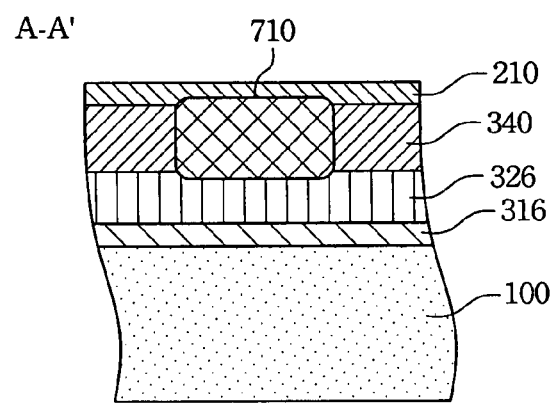
FIG. 3A illustrates a cross-sectional view from the A-A' line in FIG. 3.

FIG. 3 illustrates a repaired pixel unit according to the preferred embodiment in FIG. 1 of this invention. Referring to the FIG. 3, the pixel unit 200 has a repairing portion 710 formed by a laser welding method that adjusts the focus of a laser beam to weld the pixel electrode 210 and the data line 326 together. The repairing portion 710 connects the pixel electrode 210 and the data line 326 electrically. More specifically, the repairing portion 710 can be formed at the space between the data line 326 and the pixel electrode 210. FIG. 3A illustrates a cross-sectional view from the A-A' line in FIG. 3. Referring to the FIG. 3A, after the repairing process, the repairing portion 710 is formed between the pixel electrode 210 and the data line 326.

The electric field applied to the pixel unit 200 cannot be changed and the pixel unit 200 displays the intensity of the previous state unchangeably when the thin film transistor 300 is defective. For example, the pixel unit 200 displays as a white spot when the intensity of the previous state is high. In a preferred embodiment, the pixel unit 200 displays as a gray spot after the pixel unit 200 is repaired. More specifically, the pixel electrode 210 and the data line 326 have the same voltage level since the repairing portion 710 connects the pixel electrode 210 and the data line 326 electrically. After being repaired, the intensity of the pixel unit 200 changes continuously with a high frequency caused by the driving signal on the data line 326 so that the pixel unit 200 appears stationary spot to the human eye. In general, the pixel unit 200 displays as a gray spot, which can decrease the contrast between the pixel unit 200 and the adjacent pixel thereof. Thus, the display quality of the pixel unit 200 can be improved. It should be noted that the present invention is not intended to be limited to repair a white spot. Similarly, connecting the pixel electrode 210 and the data line 326 electrically can also repair a dark spot. It can be obtained by choosing an E-ink with reverse charged particles.

Figure 4:
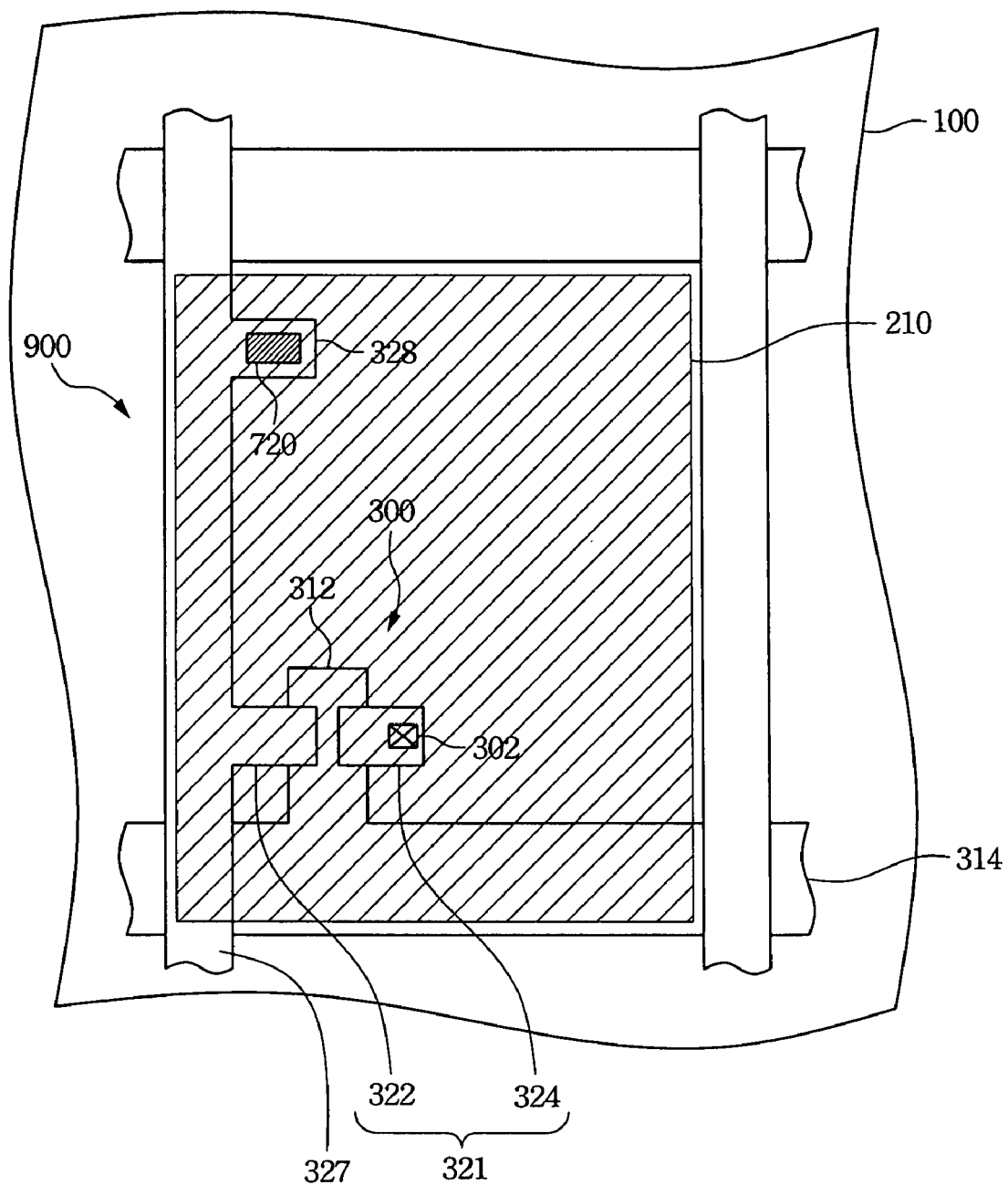
FIG. 4 illustrates a pixel unit of a thin film transistor array substrate according to another preferred embodiment of the present invention.

FIG. 4 illustrates a pixel unit of a thin film transistor array substrate according to another preferred embodiment of the present invention. Referring to the FIG. 4, a pixel unit 900 disposed on a first substrate 100 includes a thin film transistor 300 and a pixel electrode 210. The pixel unit 900 is connected with a scan line 314 and a data line 327. The thin film transistor 300 has a gate electrode 312 connected electrically to the scan line 314, a source electrode 322 connected electrically to the data line 326 and a drain electrode 324 electrically to the pixel electrode 210 via a contact window 302. The data line 327 has a protruding portion 328. A portion of the pixel electrode 210 is located above the data line 327 and the protruding portion 328. A repairing portion 720 can be formed at the space between the protruding portion 328 and the pixel electrode 210 when the pixel unit 900 is defective. For example, adjusting the focus of a laser beam to weld the pixel electrode 210 and the data line 327 together on the protruding portion 328, thereby connecting the pixel electrode 210 and the data line 327 electrically. It is worth noting that locating the repairing portion 720 on the protruding portion 328 can prevent the data line 327 being damaged during the laser welding process. Thus, the yield of the E-ink display can be improved.

According to preferred embodiments mentioned above, the E-ink display and the method for repairing the same have the following advantages. Firstly, a defective pixel unit can be repaired by connecting a pixel electrode and a data line of the pixel unit electrically, thus improving the quality of the E-ink display. Secondly, since a repairing portion can be formed directly at the space between the data line and the pixel electrode, a defective pixel unit can be repaired without any added structure. Thirdly, repairing the pixel unit on a protruding portion of a data line can prevent the data line from being damaged during the laser welding process, thus increasing the yield of the E-ink display.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An E-ink display comprising:
a first substrate having a plurality of pixel units, each of the pixel units connected with a scan line and a data line, at least one of the pixel units being repaired;
a second substrate opposed to the first substrate, the second substrate having a transparent electrode layer; and
an E-ink layer sandwiched between the first substrate and the second substrate, the E-ink layer having a plurality of charged particles and liquid, at least one optical characteristic of the pixel unit is varied by the dispersion state of charged particles in the liquid;
wherein each of the pixel unit comprises a thin film transistor and a pixel electrode, the thin film transistor having a gate electrode, a source electrode and a drain electrode, wherein the gate electrode, the source electrode and the drain electrode are connected electrically to the scan line, the data line and the pixel electrode respectively, wherein the data line comprises a protruding portion and the pixel electrode is located over the protruding portion, and wherein a repairing portion is formed at the space between the protruding portion and the pixel electrode to weld the pixel electrode and the protruding portion of the data line together so as to repair the at least one of the pixel units.

2. An E-ink display as recited in claim 1, wherein the E-ink layer comprises a plurality of microcapsules.

3. An E-ink display as recited in claim 1, wherein the thin film transistor is a top-gate-type thin film transistor.

4. An E-ink display as recited in claim 1, wherein the thin film transistor is a bottom-gate-type thin film transistor.

* * * * *